US 9,158,352 B2

(12) United States Patent
Crisp et al.

(10) Patent No.: US 9,158,352 B2
(45) Date of Patent: Oct. 13, 2015

(54) POWER BOOSTING CIRCUIT FOR SEMICONDUCTOR PACKAGING

(71) Applicant: Tessera, Inc., San Jose, CA (US)

(72) Inventors: Richard Dewitt Crisp, Hornitos, CA (US); Michael C. Parris, Colorado Springs, CO (US); Mark Kroot, Los Altos Hills, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/245,773

(22) Filed: Apr. 4, 2014

(65) Prior Publication Data

US 2014/0333371 A1 Nov. 13, 2014

Related U.S. Application Data

(63) Continuation of application No. 13/287,237, filed on Nov. 2, 2011, now Pat. No. 8,692,611.

(30) Foreign Application Priority Data

Aug. 17, 2011 (KR) .................. 10-2011-0081620

(51) Int. Cl.
*G05F 1/10* (2006.01)
*G06F 1/26* (2006.01)

(52) U.S. Cl.
CPC ........... *G06F 1/26* (2013.01); *H01L 2924/0002* (2013.01)

(58) Field of Classification Search
CPC ............. G05F 1/46; G05F 1/56; G05F 1/575; G05F 1/59; G05F 3/08; G05F 3/20; G05F 3/24

See application file for complete search history.

(56) References Cited

U.S. PATENT DOCUMENTS

| 7,002,397 | B2 * | 2/2006 | Kubo et al. ................... 327/534 |
| 7,257,004 | B2 | 8/2007 | Costello |
| 7,291,896 | B2 | 11/2007 | Nair |
| 7,414,897 | B2 * | 8/2008 | Do ........................... 365/189.09 |
| 7,457,161 | B2 * | 11/2008 | Sakurai et al. ........... 365/185.18 |
| 7,868,685 | B2 * | 1/2011 | Kitaura ........................ 327/538 |
| 8,030,989 | B2 * | 10/2011 | Song ............................ 327/541 |
| 8,139,327 | B2 * | 3/2012 | Ito et al. ......................... 361/18 |
| 8,314,647 | B2 * | 11/2012 | Shimizu et al. ............... 327/534 |
| 8,692,611 | B2 | 4/2014 | Crisp et al. |
| 2002/0084798 | A1 | 7/2002 | Osburn et al. |
| 2003/0160597 | A1 | 8/2003 | Huang et al. |

(Continued)

FOREIGN PATENT DOCUMENTS

| KR | 20070031463 | 3/2007 |
| KR | 20070070099 | 7/2007 |

(Continued)

OTHER PUBLICATIONS

International Search Report and Written Opinion for PCT/US2011/058935 dated May 7, 2012.

*Primary Examiner* — Jeffrey Zweizig
(74) *Attorney, Agent, or Firm* — Forefront IP Lawgroup, PLLC

(57) ABSTRACT

A microelectronic package includes a microelectronic element operable to output a discrete-value logic signal indicating an imminent increase in demand for current by at least some portion of the microelectronic element. An active power delivery element within the package is operable by the logic signal to increase current delivery to the microelectronic element.

19 Claims, 4 Drawing Sheets

(56) References Cited

U.S. PATENT DOCUMENTS

| | | |
|---|---|---|
| 2003/0198033 A1 | 10/2003 | Panella et al. |
| 2004/0136242 A1 | 7/2004 | Micheloni et al. |
| 2005/0133901 A1 | 6/2005 | Edwards et al. |
| 2006/0077745 A1 | 4/2006 | Kitazaki et al. |
| 2007/0145922 A1 | 6/2007 | Ito et al. |
| 2008/0304306 A1 | 12/2008 | Chang et al. |
| 2009/0077402 A1 | 3/2009 | Huang et al. |
| 2009/0180345 A1 | 7/2009 | Ch'Ng et al. |
| 2009/0296360 A1 | 12/2009 | Doblar et al. |

FOREIGN PATENT DOCUMENTS

| | | |
|---|---|---|
| KR | 20070089962 | 9/2007 |
| KR | 20090029360 | 3/2009 |
| KR | 20090098231 | 9/2009 |

\* cited by examiner

POWER BOOSTING CIRCUIT FOR SEMICONDUCTOR PACKAGING

CROSS-REFERENCE TO RELATED APPLICATIONS

The present application is a continuation of U.S. patent application Ser. No. 13/287,237, filed Nov. 2, 2011, now U.S. Pat. No. 8,692,611, which claims priority from Korean Application No. 10-2011-0081620 filed Aug. 17, 2011, all of which are hereby incorporated herein by reference.

BACKGROUND OF THE INVENTION

The subject matter of the present application relates to microelectronic assemblies, e.g., microelectronic packages which include one or more semiconductor chips having active devices thereon, and more particularly to a power boosting circuit for semiconductor packaging.

Microelectronic elements, e.g., semiconductor chips, are thin, flat elements which can incorporate integrated circuits including active semiconductor devices such as transistors, diodes, etc., and wiring which provides electrical interconnections. Semiconductor chips may also or alternatively include passive devices such as capacitors, inductors or resistors. In particular constructions, a microelectronic element can include one or more semiconductor chips having an encapsulant on one or more surfaces thereof and having electrically conductive elements electrically connected with contacts of the one or more semiconductor chips, the contacts being exposed at a surface of the microelectronic element. In some cases, a microelectronic element can be a fan-out wafer level microelectronic unit containing one or more semiconductor chips in which an encapsulant covers at least edges of the one or more semiconductor chips, and in which electrically conductive traces extend along a surface of the one or more chips and onto a surface of the encapsulant beyond an edge of one or more chips.

Certain types of microelectronic elements are subject to fluctuating power demand. The power demand can vary between low demand in periods of relative inactivity and high demand in periods of high activity.

Among conventional approaches for responding to the fluctuating power demand is a system power supply capable of increasing its output of current to maintain a voltage at an output of the power supply voltage relatively constant. Decoupling capacitors are also sometimes electrically connected with power supply inputs of a system or microelectronic package to help satisfy transient increases in the demand for current.

Korean Patent Publication Nos. 2007-070099, 2007-0031463, 2009-0029360 and United States Patent Publication Nos. 2007/0145922, 2004/0136242, 2006/0077745, 2008/0304306 and 2009/0180345 describe various approaches for power regulation in accordance with the prior art.

Further improvements can be made to microelectronic packages to regulate the delivery of power to a microelectronic element, e.g., semiconductor chip, therein.

SUMMARY OF THE INVENTION

In accordance with an aspect of the invention, a microelectronic package is provided which includes packaging structure having terminals for connection to a circuit panel, and a microelectronic element affixed with the packaging structure, the microelectronic element having contacts including a power supply contact and configured to output a discrete value control signal signaling an imminent increase in a demand for power. A power delivery element is affixed with the packaging structure, and electrical connections couple the contacts and the power delivery element with the terminals. The power delivery element may be configured to increase delivery of power to the microelectronic element upon receiving the control signal.

In one example, the power delivery element may include a voltage regulator operable to modulate a flow of current to the microelectronic element to maintain a voltage level at the power supply contact.

In one example, the power delivery element may include a transistor operable to modify a flow of current to the microelectronic element. The power delivery element may include a switch operable by the discrete value control signal and further include a transistor operable to vary the flow of current between the microelectronic element and the power delivery element in accordance with a variation of a voltage level of a signal within a continuous range. In such example, the transistor can be electrically connected in a current path between at least one of the terminals and the power supply input contact of the microelectronic element.

A first voltage regulator of the microelectronic package can be configured to output a continuously variable signal to the transistor to vary the flow of current according to the variation of the voltage level, and a second voltage regulator can be configured to output a discrete value control signal for operating a switch to supply increased current to the power supply input when the microelectronic element outputs a discrete value control signal.

In accordance with an aspect of the invention, a microelectronic package is provided which may include a microelectronic element operable to output a discrete-value logic signal indicating an imminent increase in demand for current by at least some portion of the microelectronic element. An active power delivery element within the package may be operable by the logic signal to increase current delivery to the microelectronic element.

In accordance with such aspect, the active power delivery may be a transistor having a current path operable by the logic signal.

In accordance with such aspect, the active power delivery element may include a voltage regulator element operable by the logic signal.

In accordance with a particular aspect of the invention, the package may include a silicon interposer, and the interposer can include an active device of the active power delivery circuit.

The active power delivery element may be connected to a capacitor and may be operable to deliver current from the capacitor to the microelectronic element.

In one example, such capacitor can be mounted to terminals on the package. Alternatively, such capacitor can be integrated within the package.

A system in accordance with an embodiment of the invention can include a microelectronic package in accordance with one or more of the above-described aspects of the invention, and one or more other electronic components electrically connected to the structure. Such system may further include a housing, the microelectronic package and one or more other electronic components being mounted to the housing.

DETAILED DESCRIPTION

Figure 1:
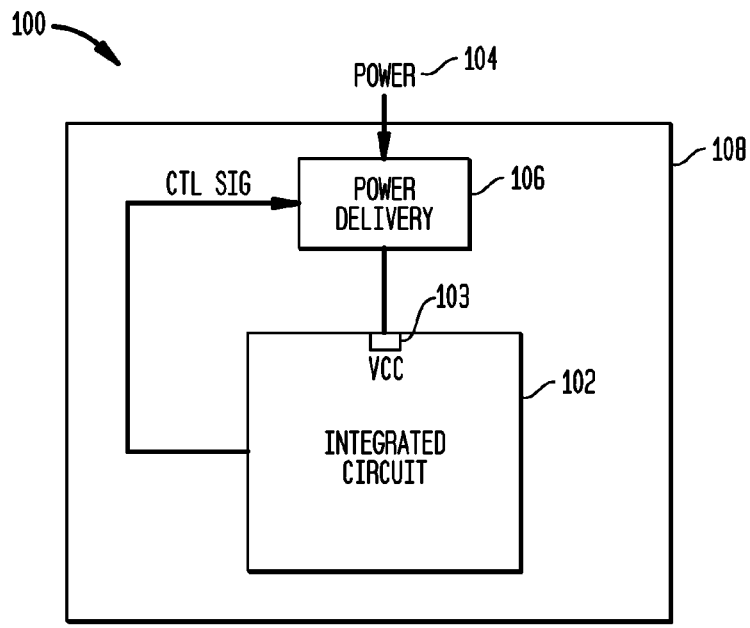
FIG. 1 illustrates a microelectronic package in accordance with an embodiment of the invention.
Figure 1A:
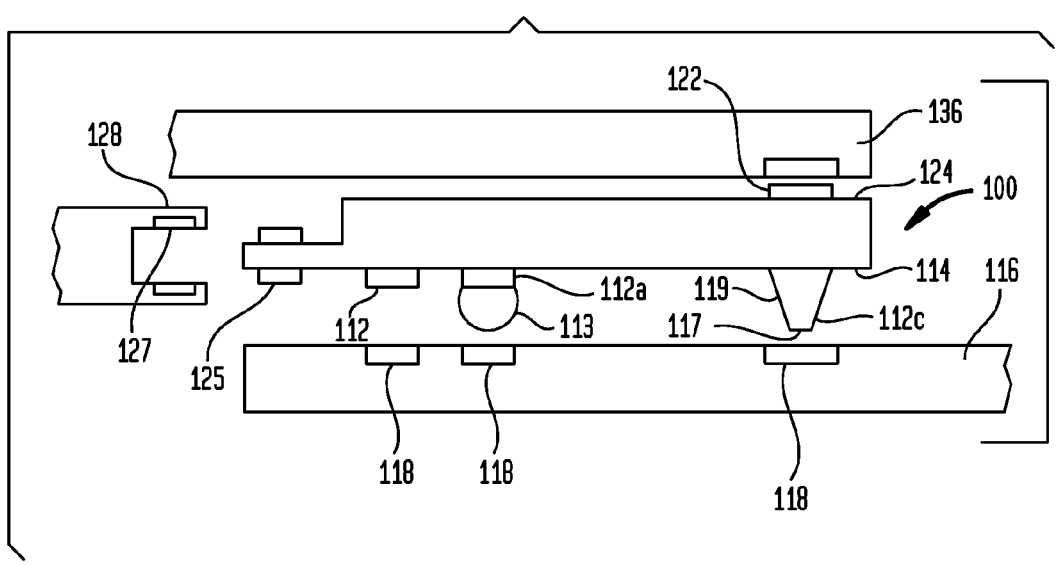
FIG. 1A is a sectional view further illustrating a microelectronic package and its interconnection to one or more external components in accordance with an embodiment of the invention.

FIG. 1 is a schematic diagram illustrating a microelectronic package 100 according to an embodiment of the invention. As seen in FIG. 1, a microelectronic element 102 in the package typically is a semiconductor chip embodying an integrated circuit including a large number of electronically interconnected active devices. For example, the semiconductor chip can have a predominant function as a logic chip, e.g., as a programmable general or special purpose processor, or hardware device, e.g., microcontroller, field programmable gate array ("FPGA"), digital signal processor, baseband processor, etc., among others. In other examples, the chip can have a predominant function as a memory storage array, or may have a special function other than logic or memory, such as radio frequency communication, or audio or video processing, among many different types of possible functions it can serve. In a further example, the chip can be a "system on a chip" ("SOC") device which incorporates circuitry supporting a primary logic function, e.g., processor, and at least one other system function such as a relatively large memory storage array, among others.

The microelectronic element is configured to receive current from an external source of power (104) through a power supply input at a contact 103 of the chip labeled "VCC". An active power delivery element 106 is provided between the power source (104) and the contact 103. This element 106 can function as a voltage regulator, e.g., an element configured to increase delivery of current to the microelectronic element upon sensing an increase in a demand therefor.

The microelectronic element 102 and the active power delivery element 106 can be packaged together within a single microelectronic package 100, i.e., a package having packaging structure 108 including a plurality of exposed terminals for connecting the package with an external component such as a circuit panel, e.g., circuit board or flexible circuit panel, another microelectronic package, one or more microelectronic elements or other components, e.g., active or passive components. For example, the package may have a plurality of terminals 112 at a first surface 114 for electrically interconnecting the package 100 with component (e.g., circuit panel or package, etc.) 116 through contacts 118 of such component. Terminals can be metallic pads 112, or metallic pads 112a with joining units 113, e.g., electrically conductive masses, thereon such as solder, tin, indium, conductive paste, etc. In another example, terminals 112c can be or can include solid metal posts having end surfaces 117 and edge surfaces 119 extending away from the end surfaces 117. In yet another example, terminals 122 can be provided at a second surface for electrical interconnection with an external component as defined above. In a particular example, the package 100 can have terminals 112, 122 exposed at first and second opposed surfaces 114, 124 for electrical interconnection with respective first and second external components 116, 136. In yet another example, the package 100 may have terminals 125 at one or more opposed surfaces of a connector of the package for establishing electrical interconnection with corresponding electrically conductive contacts 127 of a socket 128 (component) of a system, subsystem, or assembly to which it can be mated. These are only a few of the ways in which terminals of a package 100 can be provided for electrical interconnection with an external component.

In one example, the microelectronic element 102 and the power delivery element 106 can each be mounted to a package element 108 such as a sheet-like dielectric element or a substrate having a coefficient of thermal expansion ("CTE") of less than 12 parts per million per degree Celsius (ppm/° C.) (e.g., a substrate consisting essentially of glass, ceramic or semiconductor material or other low CTE material such as liquid crystal polymer, for example.) having conductive elements thereon. In some embodiments, the packaging structure can include one or more chip carriers, tape automated bonding ("TAB") substrates, multi-layer substrates or multi-chip module element among others, or a lead frame in which the one or more semiconductor chips and one or more substrates are encapsulated within a single unit, as with an overmold or other encapsulant, for example, and the packaging structure presents an external electrical interface having terminals for electrical connection with an external component, such as a circuit panel or microelectronic element or microelectronic package, etc. Conductive elements of the packaging structure element 108 such as pads, bumps, traces, leads, or other features thereon, can electrically connect the microelectronic element with the power delivery element 106. In another example, the microelectronic element 102 and the power delivery element 106 can be incorporated together in a fan-out wafer level package such as typically includes an encapsulant overlying at least edges of the microelectronic element and having surfaces along which conductive elements, e.g., deposited traces and pads extend, and in which conductors, e.g., metalized vias or traces are deposited, e.g., plated, stenciled, or printed on contacts of the microelectronic element and power delivery element. In one embodiment, the package can include a silicon interposer which includes active devices of an active power delivery circuit 106 to which microelectronic element 102 is electrically connected.

As further shown in FIG. 1, the microelectronic element 102 is configured to output a control signal (CTL SIG). The control signal typically is a discrete value logic signal for signaling an imminent increase in demand for current by the microelectronic element 102. Thus, in one embodiment CTL SIG can be a discrete-valued binary signal having two levels: a first level which when active represents increased demand, and a second, lower level which when active indicates lower demand. In another embodiment, CTL SIG may have a greater number of discrete signal levels so as to signal the highest demand when the signal has a first level, a mid-range demand when the signal has a second level, and the lowest demand when the signal has a third level. It is also possible for the control signal to be transmitted on two or more signal lines connected to contacts of the microelectronic elements such that the combination of discrete value signal levels on the two or more signal lines indicates different levels of the current required by the microelectronic element.

Typically, a circuit within the microelectronic element activates CTL SIG when an increase in demand is imminent, i.e., is about to occur, and would soon be detectable at the power supply contact 103. Thus, in one embodiment the microelectronic element can activate CTL SIG when a large increase in current demand is about to occur, such as when the microelectronic element is about to exit a sleep mode or a standby mode of operation. The increased demand need not be detectable at the power supply contact 103 at the precise moment when the microelectronic element activates the control signal. In a particular embodiment, some increase in the demand for power may be present at the power supply contact 103 when the control signal becomes active, but the increased demand might not be detected as such at that point in time. Even when the increase in the power demand at the contact 103 is significant by the time the control signal becomes active, the increased demand may not yet have exceeded a threshold at which the increase in demand would normally be sensed by a circuit coupled to the contact 103. Thus, by receiving a control signal indicating that increased demand for current is about to occur, by the time the increased demand actually appears, the active power delivery element 106 has already switched on and can avoid the voltage at the power supply input contact 103 from being altered, e.g., suppressed, or rather, from being suppressed beyond a permitted range from the nominal voltage level of the power supply. In this way, the operation of the microelectronic element and the power delivery element can avoid an undesirable or excessive change, e.g., drop in the power supply voltage level at the input to microelectronic element, which may help to avoid noise from being coupled onto various internal circuits of the microelectronic element 102.

Figure 2:
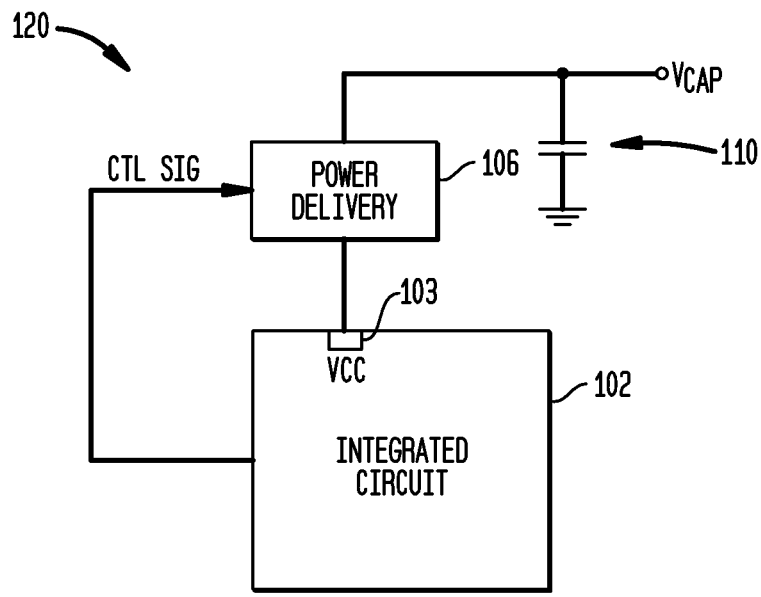
FIG. 2 illustrates a microelectronic package in accordance with an embodiment of the invention.

As seen in FIG. 2, in a microelectronic package 120 according to one example, in accordance with CTL SIG, the active power delivery element 106 modulates a flow of current to the microelectronic element 102 from an available auxiliary source. Referring to FIG. 2, in a particular example, the auxiliary source can be a capacitive element 110, e.g., a large capacitor or a group of capacitors which provides a large source of available charge to the microelectronic element 102 to satisfy increased demand for power. The capacitive element can be mounted to terminals of the package or can be integrated within the package, or some capacitors can be mounted to the terminals and some can be integrated within the package.

In one example of operation, when CTL SIG becomes active, the power delivery element 106 can turn on a switch to permit current to flow between the capacitor or group of capacitors 110 and the microelectronic element 102 to satisfy an increase in demand by the microelectronic element 102. When the increase in demand has been satisfied, or is no longer present, the power delivery element 106 can turn off the switch again so that the current no longer flows between the microelectronic element and the capacitor or group of capacitors 110. The control signal may have a discrete value, such that when the control signal is active, the power delivery element 106 turns on at a first operational level and when the control signal becomes inactive, the power delivery element 106 switches to a second operational level. In one example, the first operational level can be a level at which 110 increase is made in the delivery of power to the microelectronic element 102.

In a particular example, the capacitor or group of capacitors 110 may store charge thereon at a voltage level VCAP that is higher than the nominal power supply voltage level (VCC) to be received by the microelectronic element. In this way, the voltage on the capacitor can be drawn down to supply transient current to the microelectronic element and satisfy an increased transient demand at the power supply contact 103 of the microelectronic element. Alternatively, or in addition thereto, Vcap may come from an external supply with a capacitor or group of capacitors in or near a package element.

Figure 3:
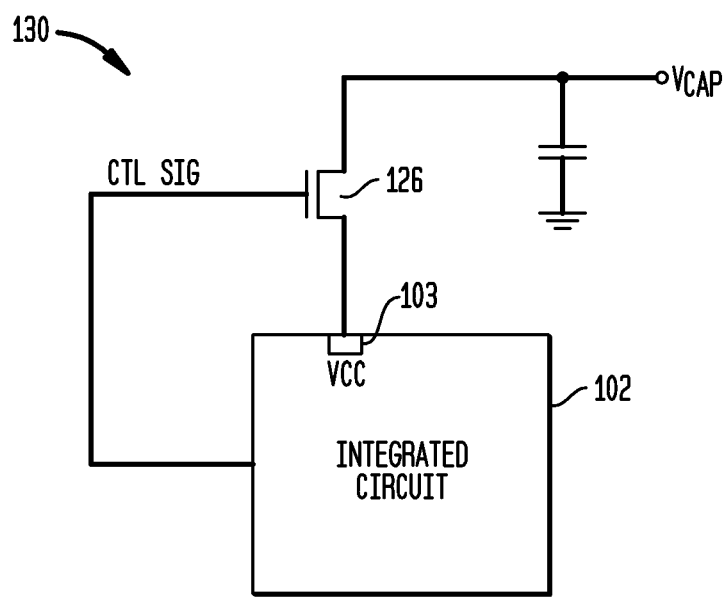
FIG. 3 illustrates a microelectronic package in accordance with an embodiment of the invention.

FIG. 3 illustrates a microelectronic package 130 in which the power delivery element includes a device 126 operable in accordance with a discrete-value signal CTL SIG from the microelectronic element to switch between different levels of current supplied to the microelectronic element 102. In one example, the device can be a field effect transistor. When CTL SIG is in a state indicating high current demand such as, for example, when the microelectronic element switches on after being in a sleep or standby mode of operation, device 126 can be operated to in a fully on condition, such that power can be delivered to the microelectronic element 102 with the highest available current. Otherwise, when the discrete value CTL SIG is in a state indicating lower demand for current, the device 126 can be operated in a partially on or standby mode of operation such that a lower amount of current is available to the microelectronic element.

In still another example (FIG. 4), the power delivery element 206 affixed with a microelectronic element 202 and packaging structure 208 in a microelectronic package 210 can include a voltage regulator circuit 212 having an input 214 electrically coupled to the power supply input contact 203 of the microelectronic element 202. Structure shown at 210 can represent a single microelectronic package. In operation, the voltage regulator 212 outputs signal N1, which may be continuously variable, to a transistor M1 to modulate a flow of current to the integrated circuit 202 from a node PS, to which a capacitive element, e.g., capacitor or group of capacitors 210 and a terminal 220 of the package are connected. When the package is installed for use in a system, a power supply can be connected to node PS through terminal 220.

In operation, the voltage regulator 212 monitors the power supply voltage at a node coupled to the contact 203 of the microelectronic element 202 and modulates the flow of current through transistor M1 by varying a control signal N1 to the transistor. Typically, control signal N1 is subject to continuous adjustment by voltage regulator 212 according to voltage level at the power supply contact 203 that is detected by the voltage regulator by way of a feedback input 205. In one embodiment, control signal N1 can have a voltage which is subject to continuous adjustment by voltage regulator 212.

In addition, when the microelectronic element 202 has increased demand, it activates the discrete-valued control signal N2. In turn, transistor M2 switches on, or switches to a discrete different operating state in which the transistor is more fully on. In such way, the transistor M2 switches to a different operating state which increases a flow of current to the microelectronic element from node PS.

Figure 5:
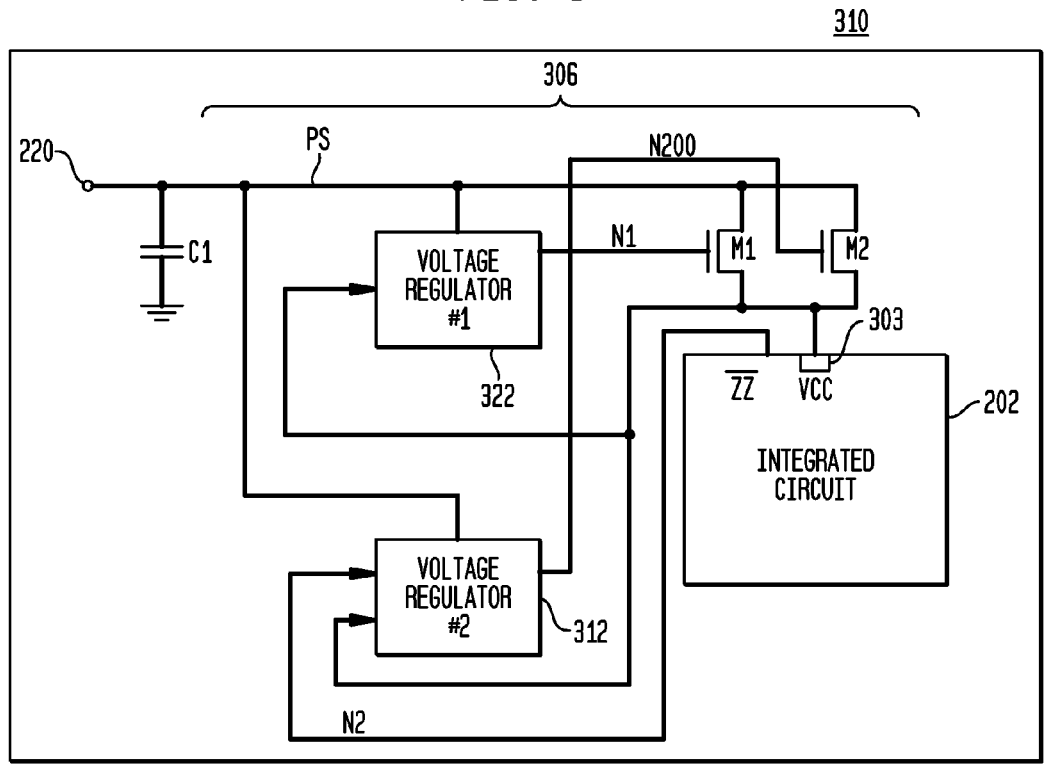
FIG. 5 illustrates a microelectronic package in accordance with an embodiment of the invention.

FIG. 5 illustrates yet another embodiment in which the power delivery element 306 affixed with a packaging structure 308 of a package 310 includes two voltage regulators 312 and 322. In operation, voltage regulator 322, using feedback received via the node to which the power supply input contact 303 is connected, generates a signal N1 to operate transistor M1 and vary a flow of current to microelectronic element 302.

Figure 4:
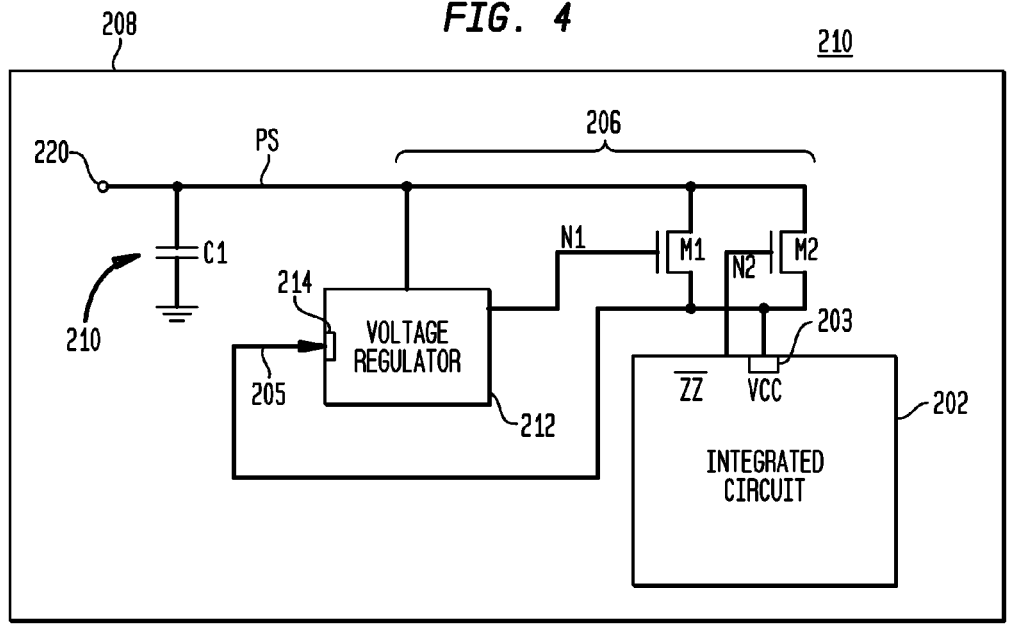
FIG. 4 illustrates a microelectronic package in accordance with an embodiment of the invention.

Voltage regulator 312 is connected to node PS and the microelectronic element 202 and can operate in like manner to voltage regulator 212 of FIG. 4. However, instead of the control signal N2 being directly connected to transistor M2, voltage regulator 312 receives the control signal N2 output by the microelectronic element and outputs a signal N200 to transistor M2 instead. In one example, voltage regulator 312 may switch signal N200 at more limited times than signal N2 is active, such as when the voltage regulator 312 also detects increased demand for power at the node connected to power supply input contact 303.

Figure 6:
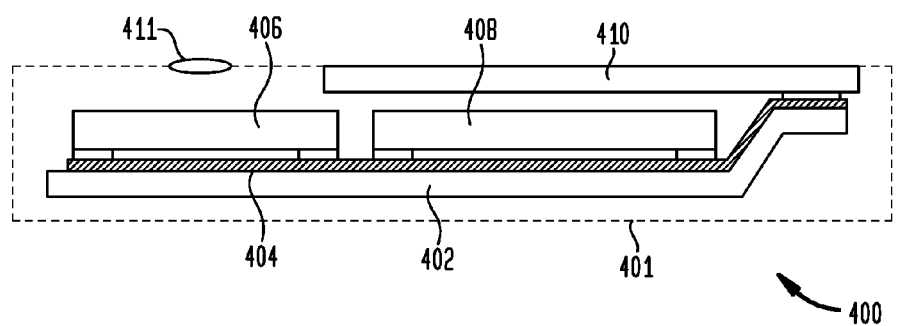
FIG. 6 illustrates a system in accordance with an embodiment of the invention.

The structures discussed above provide extraordinary interconnection capabilities. These capabilities can be used with chips of any type. Merely by way of example and without limitation to the examples discussed above, the following combinations of chips may be included in microelectronic packages or higher-level assemblies which include microelectronic packages as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 400 in accordance with a further embodiment of the invention includes a microelectronic package or structure 406 as described above in conjunction with other electronic components 408 and 410. In the example depicted, component 408 is a semiconductor chip whereas component 410 is a display screen, but any other components can be used. Of course, although only two additional components are depicted in FIG. 6 for clarity of illustration, the system may include any number of such components. The structure 406 as described above may be, for example, a microelectronic package as discussed above in connection with any of FIGS. 1, 1A and 2-5. In a further variant, both may be provided, and any number of such packages can be used. Package 406 and components 408 and 410 are mounted in a common housing 401, schematically depicted in broken lines, and are electrically interconnected with one another as necessary to form the desired circuit. In the exemplary system shown, the system includes a circuit panel 402 such as a flexible printed circuit panel or circuit board, and the circuit panel includes numerous conductors 404, of which only one is depicted in FIG. 6, interconnecting the components with one another. However, this is merely exemplary; any suitable structure for making electrical connections can be used. The housing 401 is depicted as a portable housing of the type usable, for example, in a cellular telephone or personal digital assistant, and screen 410 is exposed at the surface of the housing. Where structure 406 includes a light-sensitive element such as an imaging chip, a lens 411 or other optical device also may be provided for routing light to the structure. Again, the simplified system shown in FIG. 6 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A method of connecting and providing power to a microelectronic package with electrically conductive terminals, comprising:
coupling one or more of the electrically conductive terminals to a circuit panel,
coupling a power supply source to the circuit panel and to a power delivery element coupled to the one or more of the electrically conductive terminals of the microelectronic package,
generating a discrete value control signal from a microelectronic element coupled to the one or more of the terminals signaling an imminent increase in a demand for power, coupling the discrete value control signal to the power delivery element;
sending increased power to the microelectronic element upon or after receiving the discrete value control signal; and
regulating a voltage in the power delivery element to modulate a flow of current to the microlectronic element,
wherein the modulated flow of current is controlled by a transistor whose gate terminal is coupled to the discrete value control signal and its source and drain terminals are respectively coupled to the power supply source and the microelectronic element and further comprising modifying a flow of current to affect the output of the discrete value control signal.

2. A method of connecting and providing power to a microelectronic package with electrically conductive terminals, comprising:
coupling one or more of the electrically conductive terminals to a circuit panel,
coupling a power supply source to the circuit panel and to a power delivery element coupled to the one or more of the electrically conductive terminals of the microelectronic package,
generating a discrete value control signal from a microelectronic element coupled to the one or more of the terminals signaling an imminent increase in a demand for power, coupling the discrete value control signal to the power delivery element; and
sending increased power to the microelectronic element upon or after receiving the discrete value control signal,
wherein the providing of power includes switching by the discrete value control signal and further includes varying a flow of current between the microelectronic element and the power delivery element in accordance with a variation of a voltage level of a signal within a continuous range.

3. The method as claimed in claim 2, further comprising:
regulating a first voltage to a transistor to vary the flow of current according to a variation of the voltage level; and
regulating a second voltage configured to output a discrete value control signal for operating a switch to supply increased current to one or more power supply inputs of the microelectronic device when the discrete value control signal is outputted.

4. The method as claimed in claim 3 wherein the increased current to one or more of the power supply inputs is supplied by charging a positive terminal of a capacitor to a voltage above a nominal power supply voltage (Vcc) for operation of the microelectronic element and coupling a positive terminal of the capacitor to one or more of the power supply inputs.

5. The method as claimed in claim 2 wherein the discrete value control signal couples a capacitor charged to a voltage above a nominal power supply voltage of the microelectronic element to the one or more of electrically conductive terminals of the microelectronic package.

6. The method of claim 2 wherein the microelectronic element is an integrated circuit.

7. A microelectronic package, comprising:
a packaging structure having terminals for connection to a circuit panel; a microelectronic element affixed with the packaging structure, the microelectronic element having contacts including a power supply contact and configured to output a discrete value control signal signaling an imminent increase in a demand for power; a power delivery element affixed with the packaging structure;
electrical connections coupling the contacts and the power delivery element with the terminals, wherein the power delivery element is configured to increase delivery of power to the microelectronic element upon receiving the control signal, wherein the discrete value control signal includes discrete signal levels: one level to signal higher demand for power, a second level to signal mid-range demand for power, and a third level to signal lower demand for power.

8. The microelectronic package as claimed in claim 7, wherein the discrete value control signal is transmitted on two or more signal lines connected to contacts of the microelectronic element, wherein discrete value signal levels on the two or more signal lines indicate different levels of current required by the microelectronic element.

9. The microelectronic package as claimed in claim 7, wherein the microelectronic package comprises one or more sheet-like dielectric elements for mounting the microelectronic element and/or the power delivery element.

10. The microelectronic package as claimed in claim 9 wherein the one or more sheet-like dielectric elements have a coefficient of thermal expansion (CTE) of less than 12 parts per million per degree Celsius.

11. The microelectronic package as claimed in claim 10 wherein the one or more sheet-like dielectric elements serve as a substrate for the microelectronic element and or the power delivery element.

12. The microelectronic package as claimed in claim 11, wherein the substrate is comprised of one of more the following: glass, ceramic, semiconductor material, and liquid crystal polymer.

13. The microelectronic package as claimed in claim 7, wherein the microelectronic package further comprises one or more of the following: one or more chip carriers, tape automated bonding (TAB) substrates, multi-layer substrates, multi-chip module elements, and/or a lead frame.

14. The microelectronic package as claimed in claim 11, wherein the microelectronic package provides an encapsulation for one or more semiconductor chips and or one or more substrates within a single unit.

15. The microelectronic package as claimed in claim 7, wherein the microelectronic package provides an external electrical interface having terminals for electrical connection with an external component.

16. The microelectronic package as claimed in claim 7, wherein the microelectronic element comprises one or more of the following:
dynamic random-access memory (DRAM), static random-access memory (SRAM), and/or an application specific integrated circuit that includes one or more embedded DRAM and/or embedded SRAM.

17. The microelectronic package as claimed in claim 7 further comprising:
a capacitor or group of capacitors that store a voltage (Vcap) above nominal levels (Vcc) to be received by the microelectronic element, to supply added current to the the microelectronic element.

18. The microelectronic package as claimed in claim 7, wherein the microelectronic package is connected to an external capacitor or group of capacitors that store a voltage (Vcap) above nominal levels (Vcc) to be received by the microelectronic element, to supply added current to the microelectronic element.

19. The microelectronic package as claimed in claim 7 where the microelectronic package comprises one or more microelectronic elements and wherein one or more of the microelectronic elements provide one or more discrete value control signals to one or more power delivery elements also comprised within the microelectronic package and wherein the one or more power delivery elements provide added current to one or more of the microelectronic elements in response to the discrete value control signals.

* * * * *